US009450199B2

(12) United States Patent
Huh et al.

(10) Patent No.: US 9,450,199 B2
(45) Date of Patent: Sep. 20, 2016

(54) METHOD OF FORMING NANO CRYSTALS AND METHOD OF MANUFACTURING ORGANIC LIGHT-EMITTING DISPLAY APPARATUS INCLUDING THIN FILM HAVING THE SAME

(71) Applicant: Samsung Display Co., Ltd., Yongin-si, Gyeonggi-do (KR)

(72) Inventors: Myung-Soo Huh, Yongin (KR); Cheol-Lae Roh, Yongin (KR); Seung-Ho Choi, Yongin (KR)

(73) Assignee: Samsung Display Co., Ltd., Samsung-ro, Giheung-Gu, Yongin-si, Gyeonggi-Do (KR)

( * ) Notice: Subject to any disclaimer, the term of this patent is extended or adjusted under 35 U.S.C. 154(b) by 26 days.

(21) Appl. No.: 13/963,662

(22) Filed: Aug. 9, 2013

(65) Prior Publication Data

US 2014/0227809 A1    Aug. 14, 2014

(30) Foreign Application Priority Data

Feb. 8, 2013    (KR) ........................ 10-2013-0014649

(51) Int. Cl.
*H01L 51/52* (2006.01)
*C23C 14/00* (2006.01)
*C23C 14/08* (2006.01)
*C23C 14/58* (2006.01)

(52) U.S. Cl.
CPC ....... *H01L 51/5206* (2013.01); *C23C 14/0036* (2013.01); *C23C 14/086* (2013.01); *C23C 14/5806* (2013.01); *H01L 51/5221* (2013.01); *H01L 51/5256* (2013.01); *H01L 2251/5369* (2013.01)

(58) Field of Classification Search
CPC ...................... H01L 51/5206; H01L 51/5256
USPC ........................ 252/520.2; 257/100; 438/22
See application file for complete search history.

(56) References Cited

U.S. PATENT DOCUMENTS

| 5,397,446 A * | 3/1995 | Ishihara | C23C 14/0036 204/192.15 |
| 5,919,532 A * | 7/1999 | Sato et al. | 428/1.6 |

(Continued)

FOREIGN PATENT DOCUMENTS

| EP | 0861920 A1 | 9/1998 |
| JP | 2011171703 A | 9/2011 |

(Continued)

OTHER PUBLICATIONS

Properties of Indium Tin Oxide (ITO) Films Prepared by R.F. Reactive Magnetron Sputtering at Different Pressures, L. Meng et al. (vol. 303, No. 1-2, Jul. 15, 1997, pp. 151-155).*

(Continued)

*Primary Examiner* — Vincent Wall
(74) *Attorney, Agent, or Firm* — Robert E. Bushnell, Esq.

(57) ABSTRACT

A method of forming nanocrystals and a method of manufacturing an organic light-emitting display apparatus that includes a metal compound thin film having the nanocrystals. The method of forming nanocrystals includes forming a metal compound thin film under a first pressure by using a reactive sputtering process, and forming the nanocrystals in the metal compound thin film under a second pressure that is lower than the first pressure by using the reactive sputtering process.

16 Claims, 5 Drawing Sheets

(56) References Cited

U.S. PATENT DOCUMENTS

| | | | |
|---|---|---|---|
| 8,344,374 B2* | 1/2013 | Yamazaki et al. | 257/43 |
| 2010/0065840 A1* | 3/2010 | Yamazaki et al. | 257/43 |
| 2010/0213460 A1 | 8/2010 | Kondo et al. | |
| 2010/0230814 A1 | 9/2010 | Marks et al. | |
| 2011/0101942 A1 | 5/2011 | Yamazaki et al. | |
| 2012/0175569 A1 | 7/2012 | Nakayama et al. | |
| 2012/0241811 A1* | 9/2012 | Kim et al. | 257/100 |

FOREIGN PATENT DOCUMENTS

| | | |
|---|---|---|
| KR | 1020090012198 A | 2/2009 |
| KR | 1020110083474 A | 7/2011 |
| KR | 10-2012-0051656 A | 5/2012 |

OTHER PUBLICATIONS

Ponon, et al., "Effect of deposition conditions and post deposition anneal on reactively sputtered titanium nitride thin films", Thin Solid Films 578, 2015, pp. 31-37.*

Tarniowy, et al., "The effect of thermal treatment on the structure, optical and electrical properties of amorphous titanium nitride thin films", Thin Solid Films, 311, 1997, pp. 93-100.*

The extended European Search Report issued on Jun. 2, 2014 by EPO in connection with European Patent Application No. 13185720.3 which also claims Korean Patent Application No. 10-2013-0014649 as its priority document.

\* cited by examiner

METHOD OF FORMING NANO CRYSTALS AND METHOD OF MANUFACTURING ORGANIC LIGHT-EMITTING DISPLAY APPARATUS INCLUDING THIN FILM HAVING THE SAME

CLAIM OF PRIORITY

This application claims priority under 35 U.S.C. §119 of Korean Patent Application No. 10-2013-0014649, filed on Feb. 8, 2013, in the Korean Intellectual Property Office, the disclosure of which is incorporated herein in its entirety by reference.

BACKGROUND OF THE INVENTION

1. Field of the Invention

Embodiments of the present invention generally relates to a method of forming nanocrystals and a method of manufacturing an organic light-emitting display apparatus including a thin film having the nanocrystals, and more particularly, to a method of forming nanocrystals by a sputtering process and a method of manufacturing an organic light-emitting display apparatus including a thin film having the nanocrystals.

2. Description of the Related Art

Processes of forming a thin film used in electronic devices include a deposition process, an electroplating process, a chemical vapor deposition process, or a sputtering process. Among the processes, the sputtering process is widely used because the sputtering process makes control of minute texture and constituents of a thin film easy and also makes mass production possible.

A sputtering technique is a film forming technique in which plasma is used for generating ions that hit a sputtering target so that atoms of the sputtering target are stacked on a substrate as a film. The sputtering technique is used for generating metal films, oxide films, nitride films, and semiconductor films in various manufacturing processes that are particularly used in semiconductor and photo-electronic industries.

When thin films are stacked at a low temperature by using a sputtering technique, amorphous films are formed. However, the amorphous films have limits in increasing the density or optical characteristics of the amorphous films. Although attempts have been made to overcome the limits in the thin-film forming process by doping or adding another material, the adding of a foreign material may deteriorate other desired characteristics of the thin films.

SUMMARY OF THE INVENTION

The present invention provides a method of forming nanocrystals in a thin film at a low temperature.

The present invention also provides a method of manufacturing an organic light-emitting display apparatus including the thin film having the nanocrystals.

According to an aspect of the present invention, there is provided a method of forming nanocrystals, the method including forming a metal compound thin film under a first pressure by using a reactive sputtering process, and forming the nanocrystals in the metal compound thin film under a second pressure that is lower than the first pressure by using the reactive sputtering process.

The metal compound may be a metal oxide or a metal nitride.

The first pressure may be five times greater or more than the second pressure.

The first pressure may be in a range from about 0.1 Pa to about 1 Pa, and the second pressure may be in a range from about 0.01 Pa to about 0.1 Pa.

At least one of size and density of the nanocrystals may be increased as a pressure difference between the first pressure and the second pressure increases.

The metal compound thin film may be an amorphous phase.

The metal compound thin film may have a thickness of 100 nm or less.

The nanocrystals may be formed at a temperature of 100° C. or less.

The density of the metal compound thin film may be increased by forming the nanocrystals in the metal compound thin film.

An optical band gap energy of the metal compound thin film may be increased by forming the nanocrystals in the metal compound thin film.

The nanocrystals may be formed by crystallizing a metal in the metal compound thin film.

The nanocrystals may be formed by using a kinetic energy of sputtered particles.

At least one of size and density of the nanocrystals is increased as the kinetic energy of the sputtered particles is increased.

The metal compound thin film may include at least one selected from the group consisting of ITO, ZnO, SnOx, ZrOx, TiOx, AlOx, TiN, SiN, and AlN.

According to an aspect of the present invention, there is provided a metal compound thin film having nanocrystals formed according to the method described above.

According to an aspect of the present invention, there is provided a method of manufacturing an organic light-emitting display apparatus, the method including forming a metal compound thin film on a substrate on which at least a portion of constituent elements of the organic light-emitting display apparatus is formed under a first pressure by using a reactive sputtering process, and forming nanocrystals in the metal compound thin film under a second pressure that is lower than the first pressure by using the reactive sputtering process.

The organic light-emitting display apparatus may include a first electrode, an intermediate layer that includes an organic light-emitting layer, a second electrode, and an encapsulating layer on the substrate, wherein the metal compound thin film in which the nanocrystals are formed is included in the encapsulating layer.

The encapsulating layer may include an inorganic layer and an organic layer.

The inorganic layer may include the metal compound thin film having the nanocrystals.

The metal compound thin film may be an amorphous phase.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Hereafter, the present invention will be described more fully with reference to the accompanying drawings, in which exemplary embodiments of the present invention are shown.

In the drawings, like reference numerals are used to indicate like elements throughout the specification. In describing the present invention, when practical descriptions with respect to a related known function and configuration may unnecessarily make the scope of the present invention unclear, the descriptions thereof will be omitted.

Figure 1:
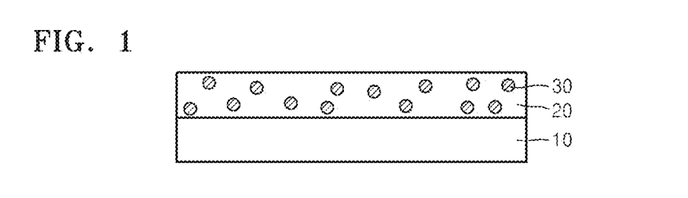
FIG. 1 is a schematic drawing of a metal compound thin film having nanocrystals according to an embodiment of the present invention.

FIG. 1 is a schematic drawing of a metal compound thin film 20 having nanocrystals 30 according to an embodiment of the present invention. Referring to FIG. 1, the nanocrystals 30 may be formed in the metal compound thin film 20. The metal compound thin film 20 having nanocrystals 30 may be formed on a substrate 10. Here, the metal compound thin film 20 may be a metal oxide or a metal nitride, and the nanocrystals 30 may be formed of a metal.

The metal compound thin film 20 may be formed of a metal, for example, Zn, Cu, In, Ag, Sn, Sb, Ni, and Fe, and oxygen or nitrogen as constituent elements. For example, the metal compound thin film 20 may be formed of a metal oxide selected from the group consisting of ZnO, SnOx, ZrOx, TiOx, and AlOx, or a metal nitride selected from the group consisting of TiN, SiN, and AlN.

The nanocrystals 30 increase the density of a thin film as well as an optical characteristic of the thin film by being distributed in the metal compound thin film 20. Here, the nanocrystals 30 may be formed of the same metal used to form the metal compound thin film 20. For example, the nanocrystals 30 may be formed of at least one of Zn, Cu, In, Ag, Sn, Sb, Ni, and Fe. Also, the nanocrystals 30 may have a size in a range from about 1 nm to about 20 nm. The size and density of the nanocrystals 30 may be controlled by a kinetic energy of sputtering particles during a reactive sputtering process. Also, the kinetic energy of sputtering particles may be controlled by pressure during a sputtering process.

Figure 2:
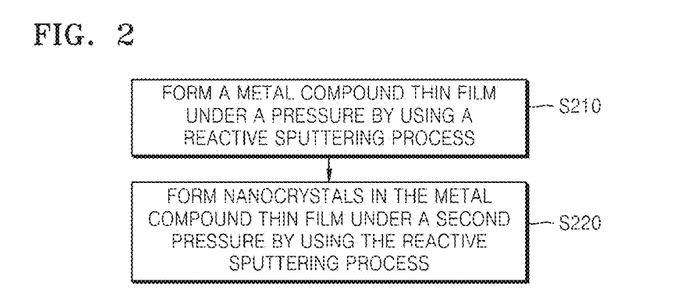
FIG. 2 is a process flowchart showing a method of forming nanocrystals in a thin film, according to an embodiment of the present invention.
Figure 3:
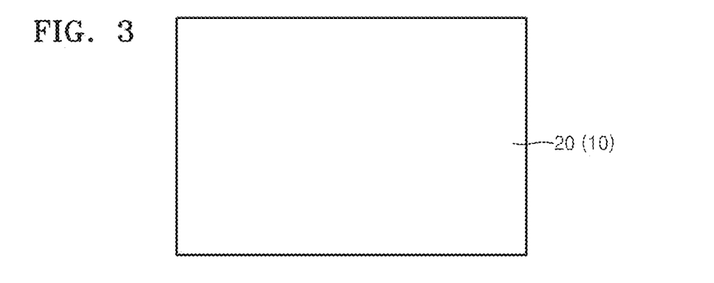
FIGS. 3 and 4 are schematic plan views illustrating a method of forming nanocrystals in a metal compound thin film, according to an embodiment of the present invention.
Figure 4:
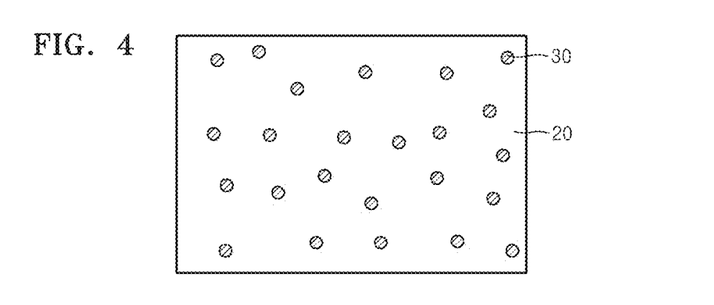

FIG. 2 is a process flowchart showing a method of forming nanocrystals in a thin film, according to an embodiment of the present invention. FIGS. 3 and 4 are schematic plan views illustrating a method of forming nanocrystals in a metal compound thin film, according to an embodiment of the present invention.

As depicted in FIGS. 2 through 4, the metal compound thin film 20 is formed on the substrate 10 by using a reactive sputtering process under a first pressure (S210). The substrate 10 may be any substrate that may be used for forming a thin film. The substrate 10 may be formed of a material selected from the group consisting of glass, GaAs, quartz, LiNbO3, LiTaO3, Si, SiC, SiO2, ZnO, MgZnO, sapphire, Pt, and SiN. The substrate 10 may be formed of sapphire or SiN. The first pressure may be a pressure that may be used in a general reactive sputtering process. For example, the first pressure may be in a range from about 0.1 Pa to about 1 Pa. Also, the reactive sputtering process may be performed at a low temperature, for example, at 100° C.

For example, in a state that the substrate 10 is placed in a chamber and a sputter gas is filled in the chamber, when a glow discharge is generated by supplying a direct current power or a radio frequency (RF) power to a cathode that includes a target, the metal compound thin film 20 may be formed on the substrate. Here, the sputter gas for sputtering may be a mixed gas of argon and oxygen. In the mixed gas flow, the flow rate of argon may be maintained at 10~30 sccm and that of oxygen may be maintained at 5~15 sccm. In addition, when the thin film is deposited, the pressure may be maintained at $6.7 \times 10^{-1}$ Pa. Since the deposition is performed at a low temperature, the formed metal compound thin film 20 may be in an amorphous phase.

There is no limit in the thickness of the metal compound thin film 20, and the thickness of the metal compound thin film 20 may be increased as the process time is increased. However, in order to reduce process time and to ensure the stability of the process, the thickness of the metal compound thin film 20 may be approximately 100 nm or less.

After changing the pressure in the chamber to a second pressure, the nanocrystals 30 are formed in the metal compound thin film 20 by using a reactive sputtering process under the second pressure (S220). Here, the second pressure may be lower than the first pressure. For example, the first pressure may be five times greater or more than the second pressure, and may be in a range from about 0.01 Pa to about 0.1 Pa.

In this way, when the pressure in the chamber is reduced, the kinetic energy of sputtered particles is increased, and thus, a metal of a metal compound may be crystallized in a thin film. While a reactive sputtering process is performed under the second pressure, the nanocrystals 30 are formed, and consequently, the thickness of the thin film may be increased.

The nanocrystals 30 may be formed by a principle as described below. In a reactive sputtering process, the kinetic energy of sputtered particles, that is, metal atoms of a target according to process pressure change, may be expressed as Equation 1.

$$E_F = (E_0 - k_B T_G)\exp\left[N\ln\left(\frac{E_f}{E_i}\right)\right] + k_B T_G \quad \text{[Equation 1]}$$

Here, $E_F$ indicates a kinetic energy of sputtered particles that reach the substrate 10, $E_0$ is a kinetic energy of sputtered particles at a surface of the target when the sputtered particles are discharged from the target, $k_B$ is the Boltzmann constant, $T_G$ is a temperature of a chamber, $E_f/E_i$ is a ratio of energies of sputtered particles before and after collision, and N is the number of collisions of the sputtered particles injected in the chamber. N and $E_f/E_i$ of Equation 1 are expressed as Equation 2 and Equation 3, respectively.

$$N=(dP_w\sigma)/(K_B T_G) \quad \text{[Equation 2]}$$

$$E_f/E_i = 1 - 2\eta/(1+\eta)^2 \quad \text{[Equation 3]}$$

Here, d in Equations 2 and 3 is a moving distance of sputtered particles, Pw is a pressure in the chamber, σ is a collision cross-section of the sputtered particle, and η is a ratio of atomic weight of collision particles.

From the above equations, it may be seen that a ratio of the kinetic energy of the sputtered particles is proportional to a vacuum level in the chamber. For example, when the process pressure is $6.7 \times 10^{-2}$ Pa, the kinetic energy of the sputtered particles is approximately 65% higher than when the process pressure is $6.7 \times 10^{-1}$ Pa.

The reason why the kinetic energy difference of sputtered particles occurs as described above is that, due to the reduction of pressure during a sputtering process, the collision of particles is reduced while the sputtered particles move to the substrate 10, and thus, the loss of the kinetic energy is minimized.

That is, when the kinetic energy of the sputtered particles is increased by reducing the process pressure, the number of collisions of the sputtered particles is reduced when the sputtered particles arrive at the substrate 10, and thus, a metal in the amorphous metal compound thin film 20 may be crystallized.

Figure 5A:
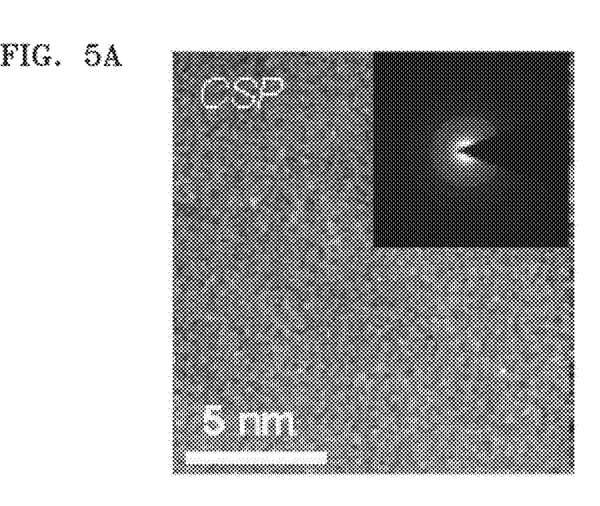
FIG. 5A is a transmission electron microscopic image of texture of a tin oxide thin film grown at a sputtering pressure of $6.7 \times 10^{-1}$ Pa.

In order to confirm the formation of nanocrystals when a pressure is reduced, as a comparative example, a tin oxide thin film having a thickness of 50 nm is formed by a reactive sputtering process under a pressure of $6.7 \times 10^{-1}$ Pa at room temperature. FIG. 5A is a transmission electron microscopic image of the texture of a tin oxide thin film grown at a pressure of $6.7 \times 10^{-1}$ Pa. As depicted in FIG. 5A, a diffraction pattern is not shown in the image. Accordingly, it is confirmed that the tin oxide thin film formed under a pressure of $6.7 \times 10^{-1}$ Pa is in an amorphous phase.

Figure 5B:
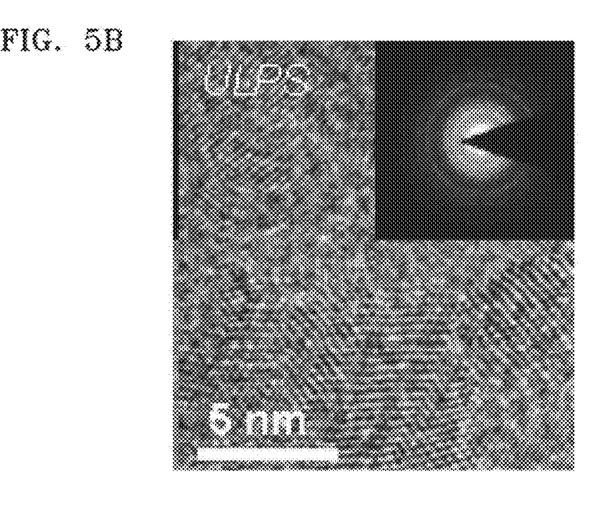
FIG. 5B is a transmission electron microscopic image of texture of a tin oxide thin film grown by changing a sputtering pressure.

After forming a portion of a tin oxide thin film at room temperature and at a pressure of $6.7 \times 10^{-1}$ Pa by using a reactive sputtering process, the process pressure of the reactive sputtering process is reduced by approximately 10 times, for example, to $6.7 \times 10^{-2}$ Pa, and a tin oxide thin film is formed by continuously performing the reactive sputtering process. The reactive sputtering process may be performed without changing the temperature. FIG. 5B is a transmission electron microscopic image of the texture of a tin oxide thin film grown by changing pressure. As depicted in FIG. 5B, a diffraction pattern is shown in the image. Accordingly, it is confirmed that crystals are formed in the tin oxide thin film grown by changing pressure.

Figure 6:
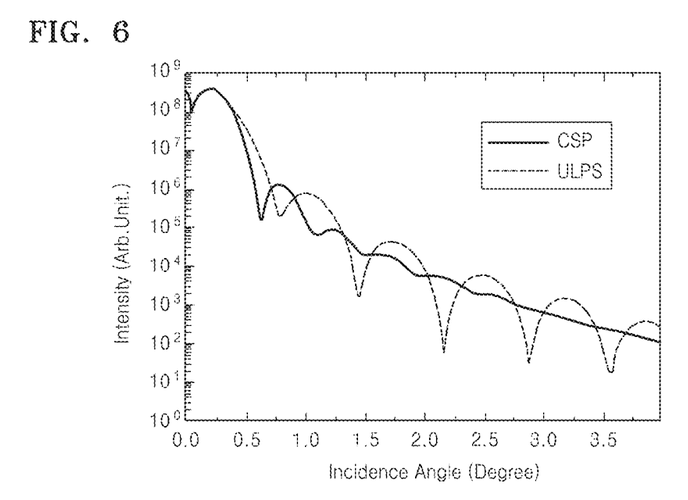
FIG. 6 is a graph showing density variation of an amorphous thin film and an amorphous thin film having nanocrystals.

FIG. 6 is a graph showing density variations of an amorphous thin film and an amorphous thin film having nanocrystals. As depicted in FIG. 6, it is confirmed that, as shown in curve at most incident angles of the sputtered particles with respect to a substrate, the density of an amorphous thin film that includes nanocrystals (curve ULPS) is greater than that of an amorphous thin film (curve CSP). That is, if an incident angle is properly controlled, an amorphous thin film having nanocrystals and a high density may be formed.

Figure 7:
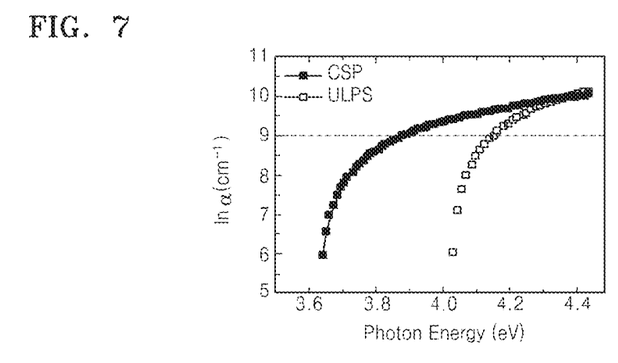
FIG. 7 is a graph showing optical band gap energies of an amorphous thin film and an amorphous thin film having nanocrystals.

FIG. 7 is a graph showing optical band gap energies of an amorphous thin film and an amorphous thin film having nanocrystals. As depicted in FIG. 7, at the same optical absorption coefficient, the optical band gap energy of an amorphous thin film having nanocrystals (curve ULPS) is increased to be greater than that of an amorphous thin film (curve CSP). For example, an optical band gap energy of an amorphous thin film is 3.9 eV at ln α=9, wherein a is a specific optical absorption coefficient. In contrast, the optical band gap energy of an amorphous thin film having nanocrystals is 4.2 eV at ln α=9. The increase in the optical band gap energy denotes that a defect that may exist in a thin film is removed.

In the above description, the process of forming a thin film having nanocrystals is a reactive sputtering process and the pressure is changed in the process of forming a metal compound thin film. However, the present invention is not limited thereto and when a metal compound thin film is formed by using a reactive sputtering process, the process may be performed at a low pressure from the beginning.

Figure 8:
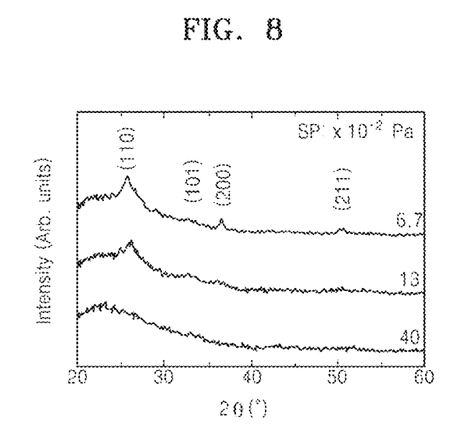
FIG. 8 is a graph of an X-ray diffraction pattern that shows a variation of crystalline in a thin film with respect to a process pressure.

In order to confirm crystalline according to pressure, a tin oxide thin film having a thickness of 100 nm is formed at room temperature by using a reactive sputtering process. The process pressure is set at $4.0 \times 10^{-1}$ Pa, $1.3 \times 10^{-1}$ Pa, and $6.7 \times 10^{-2}$ Pa to form the tin oxide thin film. FIG. 8 is a graph of an X-ray diffraction pattern that shows a variation of crystalline in a thin film with respect to a process pressure. FIG. 8 includes three curves, i.e., curve 40, curve 13, and curve 6.7, which respectively show the X-ray diffraction pattern of the tin oxide thin films formed at the process pressure of $4.0 \times 10^{-1}$ Pa, $1.3 \times 10^{-1}$ Pa, and $6.7 \times 10^{-2}$ Pa. As depicted in FIG. 8, it is confirmed that the phase of the tin oxide thin film is changed from an amorphous phase to a crystal phase according to the change of process pressure. In particular, if the crystal size of an oxide film formed under a low pressure is calculated by using the Scherrer Equation, it may be confirmed that the crystal size is approximately 7 nm.

In this way, since the loss of kinetic energy of the sputtered particles is small, the crystalline may be formed while the thin film is formed.

The metal compound thin film 20 that includes the nanocrystals 30 described above may be used as a constituent element of an organic light-emitting display apparatus. For example, the metal compound thin film 20 that includes the nanocrystals 30 may be used as an encapsulating layer of the organic light-emitting display apparatus.

Figure 9:
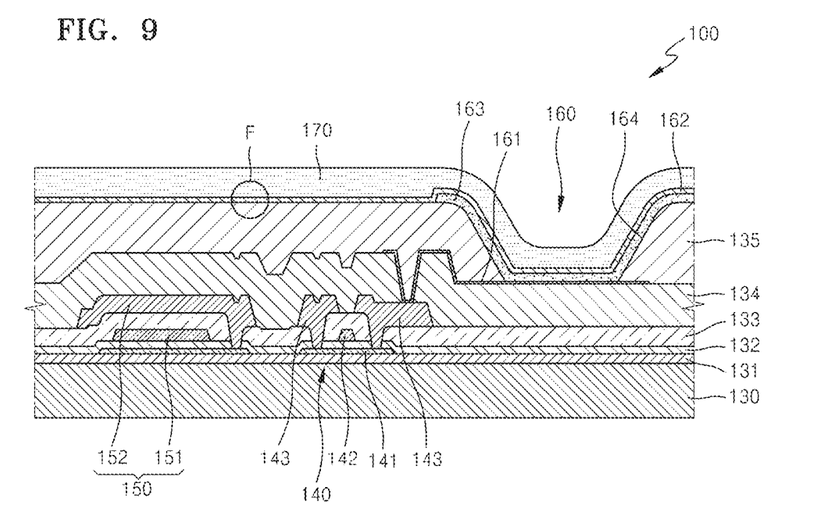
FIG. 9 is a schematic cross-sectional view of an organic light-emitting display apparatus constructed as an embodiment according to the principles of the present invention.
Figure 10:
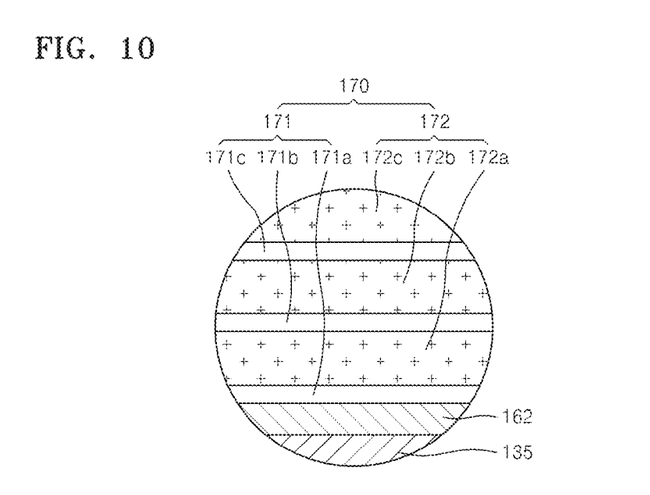
FIG. 10 is a magnified cross-sectional view of portion F of FIG. 9.

FIG. 9 is a schematic cross-sectional view of an organic light-emitting display apparatus 100 constructed as an embodiment according to the principles of the present invention. FIG. 10 is a magnified cross-sectional view of portion F of FIG. 9.

The organic light-emitting display apparatus 100 is formed on a substrate 130. The substrate 130 may be formed of a glass material, plastic material, or a metal material.

A buffer layer 131 is formed on the substrate 130 to provide a planarized surface on the substrate 130. The buffer layer 131 includes an insulating material to prevent the penetration of moisture or foreign materials into the substrate 130.

A thin film transistor (TFT) 140, a capacitor 150, and an organic light-emitting device 160 are formed on the buffer layer 131. The TFT 140 mainly includes an active layer 141, a gate electrode 142, and source/drain electrodes 143. The organic light-emitting device 160 includes a first electrode 161, a second electrode 162, and an intermediate layer 163.

The capacitor 150 includes a first capacitor electrode 151 and a second capacitor electrode 152.

More specifically, the active layer 141 having a predetermined pattern is formed on the buffer layer 131. The active layer 141 may include an inorganic semiconductor material such as silicon, an organic material, or an oxide semiconductor material, and may be formed by injecting a p-type dopant or an n-type dopant. The first capacitor electrode 151 is formed at the same level as the active layer 141. The first capacitor electrode 151 may be formed of the same material used to form the active layer 141.

A gate insulating film 132 is formed on the active layer 141. The gate electrode 142 is formed on the gate insulating film 132 to correspond to the active layer 141. An interlayer insulating layer 133 is formed to cover the gate electrode 142, and the source/drain electrodes 143 are formed on the interlayer insulating layer 133 to contact a predetermined region of the active layer 141. The second capacitor electrode 152 is formed at the same level as the source/drain electrodes 143. The second capacitor electrode 152 may be formed of the same material used to form the source/drain electrodes 143.

A passivation layer 134 is formed to cover the source/drain electrodes 143, and an additional insulating film (not shown) for planarizing the TFT 140 may further be formed on the passivation layer 134.

The first electrode 161 is formed on the passivation layer 134. The first electrode 161 is formed to be electrically connected to one of the source/drain electrodes 143. A pixel-defining film 135 is formed to cover the first electrode 161. After forming a predetermined opening 164 in the pixel-defining film 135, the intermediate layer 163 including an organic light-emitting layer is formed in a region defined by the opening 164. The second electrode 162 is formed on the intermediate layer 163.

An encapsulating layer 170 is formed on the second electrode 162. The encapsulating layer 170 may include an organic material or an inorganic material, and may have a structure in which organic materials and inorganic materials are alternately stacked.

The encapsulating layer 170 may be formed by using the metal compound thin film 20 that includes the nanocrystals 30 described above. That is, the metal compound thin film 20 may be formed on the substrate 10 on which the second electrode 162 is formed.

In particular, as shown in FIG. 10, the encapsulating layer 170 may include an inorganic layer 171 and an organic layer 172. The inorganic layer 171 includes a plurality of layers 171a, 171b, and 171c, and the organic layer 172 includes a plurality of layers 172a, 172b, and 172c. At this point, the layers 171a, 171b, and 171c of the inorganic layer 171 may each be formed of a metal compound thin film having nanocrystals.

As described above, nanocrystals may be formed in a thin film at a low temperature by using a reactive sputtering process. Thus, the density and optical characteristics of the thin film may be increased.

Also, an organic light-emitting display apparatus may be formed by using a thin film that has increased density and optical characteristics.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of forming nanocrystals, the method comprising:
    forming a metal compound thin film by performing a reactive sputtering process under a first pressure in a sputtering chamber,
    the metal compound thin film being in an amorphous phase; and
    forming the nanocrystals in the metal compound thin film by performing the reactive sputtering process in the sputtering chamber under a second pressure that is lower than the first pressure.

2. The method of claim 1, wherein the metal compound is a metal oxide or a metal nitride.

3. The method of claim 1, wherein the first pressure is five times or more greater than the second pressure.

4. The method of claim 1, wherein the first pressure is in a range from about 0.1 Pa to about 1 Pa, and the second pressure is in a range from about 0.01 Pa to about 0.1 Pa.

5. The method of claim 1, wherein at least one of size and density of the nanocrystals increases as a pressure difference between the first pressure and the second pressure increases.

6. The method of claim 1, wherein the metal compound thin film has a thickness of 100 nm or less.

7. The method of claim 1, the nanocrystals being formed at a sputtering chamber temperature of 0.100° C. or less.

8. The method of claim 1, the density of the metal compound thin film is lower than the density of the metal compound thin film having nanocrystals formed therein.

9. The method of claim 1, wherein an optical band gap energy of the metal compound thin film is increased by forming the nanocrystals in the metal compound thin film.

10. The method of claim 1, wherein the nanocrystals are funned by crystallizing a metal in the metal compound thin film.

11. The method of claim 1, wherein the metal compound thin film comprises at least one selected from the group consisting of ITO, ZrO, SnOx, ZrOx, TiOx, AlOx, TiN, SiN, and AlN.

12. The method of claim 1, comprised of forming the metal compound and the nanocrystals at a same temperature.

13. A method of manufacturing an organic light-emitting display apparatus, the method comprising:
    forming a portion of the organic light emitting display apparatus on a substrate;
    forming a metal compound thin film on the substrate by performing a reactive sputtering process under a first pressure; and
    forming nanocrystals in the metal compound thin film by performing the reactive sputtering process under a second pressure that is lower than the first pressure.

14. The method of claim 13, wherein the organic light-emitting display apparatus comprises a first electrode, an intermediate layer that comprises an organic light-emitting layer, a second electrode, and an encapsulating layer on the substrate, wherein the encapsulating layer comprises the metal compound thin film in which the nanocrystals are formed.

15. The method of claim 14, wherein the encapsulating layer comprises an inorganic layer and an organic layer.

16. The method of claim 13, wherein the metal compound thin film is in an amorphous phase.

* * * * *